United States Patent [19]

Visser

[11] 4,152,667

[45] May 1, 1979

[54] GAIN-CONTROLLED SIGNAL AMPLIFIER

[75] Inventor: Hendricus Visser, Eindhoven, Netherlands

[73] Assignee: U.S. Philips Corporation, New York, N.Y.

[21] Appl. No.: 862,001

[22] Filed: Dec. 19, 1977

[30] Foreign Application Priority Data

Dec. 29, 1976 [NL] Netherlands .................. 7614515

[51] Int. Cl.² ............................................. H03G 3/10
[52] U.S. Cl. .................................. 330/278; 330/133; 330/280; 330/282
[58] Field of Search ............... 325/405, 410; 330/278, 330/280, 281, 282, 133

[56] References Cited

U.S. PATENT DOCUMENTS

| | | | |
|---|---|---|---|
| 2,903,522 | 9/1959 | Flower | 330/278 X |
| 3,328,714 | 6/1967 | Hugenholtz | 330/133 X |
| 3,344,355 | 9/1967 | Massman | 330/133 X |
| 3,838,210 | 9/1974 | Peil | 330/133 X |

Primary Examiner—Lawrence J. Dahl
Attorney, Agent, or Firm—Thomas A. Briody; William J. Streeter; Henry I. Steckler

[57] ABSTRACT

In a multi-stage amplifier with delayed AGC-control gain control in one stage is effected by means of controllable current distribution between control transistors. The take-over point of the delayed AGC for a previous stage is determined from the ratio between the direct currents of said control transistors.

7 Claims, 3 Drawing Figures

GAIN-CONTROLLED SIGNAL AMPLIFIER

The invention relates to a gain-controlled signal amplifier comprising first and second cascaded gain-controllable amplifier stages, each having a control input for controlling the gain of the stages, and a threshold device for delaying the control of the first stage until the gain of the second stage has been adjusted to a predetermined value, the second stage being of the type in which under contact of a gain control voltage a signal current and direct current supplied by a current source are distributed over first and second semiconductor control elements having substantially exponential current characterisitics, only the first element of the two control elements being connected to the signal output of the second amplifier stage.

With the gain control of cascade-connected amplifier stages, as, for example, used in HF or IF sections of radio or TV receivers it is desired to effect the gain reduction at low signal levels in a subsequent amplifier stage, in such a way that the signal-to-noise ratio in the previous stages remains optimum. According as the signal becomes greater the gain control is shifted to previous stages such that all stages are effectively protected from non-linear distorsions, for example crossmodulation.

Such a so-called delayed AGC control of the previous stages is known per se. The following methods may, for example, be used:

1. The gain-control voltage which may generally have been obtained by means of detection from the output signal of the amplifier is supplied on the one hand to a subsequent amplifier stage and on the other hand to a threshold device which derives a delayed control voltage for a previous stage from said gain-control voltage.

2. The gain-control voltage is again supplied to the subsequent stage, but this stage also functions as a control voltage amplifier with a control voltage output from which the control voltage for the previous stage is derived. A threshold may be applied between the control voltage output of the subsequent stage and the control voltage input of the previous stage.

In both cases the previously controlled stage itself may also function as threshold device.

With the prior art methods for delayed AGC the take-over point where the control of the previous stage starts, takes place when the gain-control voltage (whether or not amplified by the subsequent stage) equals a predetermined value (threshold). Owing to the tolerance spread in components, ageing and temperature variation it may, however, happen that the take-over does not take place in the optimum point, so either the gain-control of the first stage starts too early, which is accompanied by loss in signal-to-noise ratio, or the control starts too late: then the subsequent stage is overdriven which causes non-linear distortion. Of course these problems can be avoided by suitable measures, such as an adjusting element to offset the component tolerances, temperature compensation methods and/or the use of components which are little subjected to ageing, in the places which are critical for the determination of the take-over point. However, these measures are all rather expensive.

It is an object of the invention to provide a delayed AGC control, which is particularly suitable for implementation in a monolithic integrated circuit, wherein, without the use of the above-mentioned measures such as adjustment and temperature compensation, the takeover is invariably effected in the optimum predetermined point. The principle on which the invention is based is that the take-over point is not to be determined by the value of the gain-control voltage but rather by the value of the gain-reduction of the subsequent stage. Should, for example, owing to temperature influences a given gain-reduction be realized at a somewhat higher gain-control voltage then the gain take-over remains optimum as it is determined by the gain-reduction and not by the gain-control voltage. To that end the gain-controlled signal amplifier according to the invention is characterized in that a circuit for determining the ratio between the output direct currents of the two semiconductor control elements is coupled to the output circuits of the two semiconductor control elements which circuit controls the threshold device for causing the start of the control of the first stage when said ratio has attained a predetermined value.

With the controlled signal amplifier according to the invention the gain reduction of the second stage is given by the current distribution of the signal current between the two semiconductor control elements, for, according as a greater part of the signal current is caused to flow through the second element the gain reduction is greater. By using semiconductor control elements having an exponential current-voltage characteristic it is achieved that the signal current distribution is equal to the d.c. current distribution and consequently the ratio between the direct currents of the two semiconductor control elements is a suitable measure of the gain reduction of the stage. In general this ratio can be determined accurately, for example by using resistors in the direct current output circuits of the semiconductor control elements.

This aspect and further aspects of the invention will be further explained with reference to the FIGS. shown in the drawing. Herein:

Figure 1:
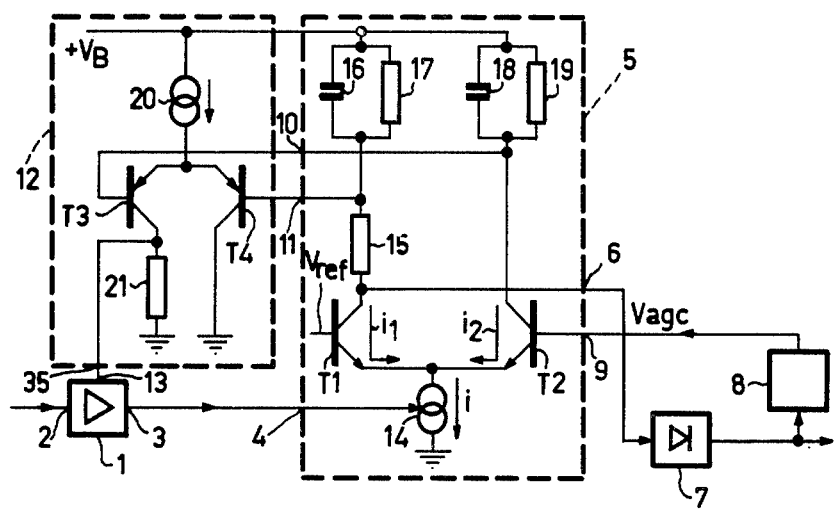
FIG. 1 shows a first embodiment of a signal amplifier to the invention.

The signal amplifier of FIG. 1 shows a first amplifier stage 1 with signal input 2 and signal output 3. The signal output 3 is connected to a signal input 4 of a second amplifier stage 5, a signal outut 6 of which is connected to a detector circuit 7. The output signal of the detector circuit 7 is applied to a control voltage generating circuit 8 which applies a gain control voltage $V_{agc}$ to a control input 9 of the amplifier stage 5. A differential D.C. voltage output 10–11 of the stage 5 is connected to the input of a difference amplifier 12, which functions as a threshold circuit, an output terminal 35 of which is connected to a control input 13 of the amplifier stage 1.

The amplifier stage 5 comprises a so-called "long tail pair" controlled-amplifier having two emitter-coupled transistors T1 and T2 whose emitters are connected to a signal current source 14, which controlled by signal-input 4. The signal current source 14 supplies a current i, which is composed of a signal current component $i_s$ and a direct current component I, to the transistors T1 and T2. The base electrode of the transistor T2 receives the gain control voltage $V_{agc}$ and that of the transistor T1 is connected to a reference potential $V_{ref}$.

A signal output resistor 15 and, in series therewith, a D.C. voltage output resistor 17 which is bypassed by a capacitor 16 is disposed in the collector circuit of the transistor T1. The collector circuit of transistor T2 comprises a D.C. output resistor 19 which is bypassed by a capacitor 18. The signal voltage across the resistor 15 is applied through the terminal 6 to the detector 7 and the D.C. voltages across the resistors 17 and 19 are applied to the difference amplifier 12 through the terminals 10 and 11.

As known, the transistor T1 and T2 have in general an exponential base-emitter characteristic which may be represented by:

$$i_1 = I_{o1}\exp\{V_{be1}/U_T\} \text{ and } i_2 = I_{o2}\exp\{V_{be2}/U_T\}$$

Herein $i_1$ and $i_2$ represent the emitter currents, $V_{be1}$ and $V_{be2}$ the base-emitter voltages and $I_{o1}$ and $I_{o2}$ the saturation currents of the base-emitter junctions in the cut-off direction of the transistors T1 and T2 respectively. $U_T$ is the so-called temperature voltage which amounts to approximately 26 mv at 300° K. From the above it follows for the ratio $i_2/i_1$ between the two emitter currents:

$$(i_2/i_1) = (I_{o2}/I_{o1}) \exp\{(V_{be2} - V_{be1})/U_T\}$$

As $V_{be2} - V_{be1} = V_{agc} - V_{ref}$ is a magnitude which is independent of the signal current i it follows that also the current distribution $i_2/i_1$ is independent of the value of the current i. This resuls in that the signal current component $i_s$ supplied by the source 14 is split undistorted into two signal current components $i_{s1}$ and $i_{s2}$ through the two transistors $T_1$ and $T_2$. In addition, this results in that the direct current component I supplied by the source 14 is distributed in the same ratio as the signal current $i_s$ across the transistors T1 and T2. so $$I_2/I_1 = i_{s2}/i_{s1} = i_2/i_1 = I_{o2}/I_{o1} \exp\{(V_{agc} - V_{ref})/U_T\}$$

The ratio $i_{s2}/i_{s1}$ between the signal current components actually determines the gain reduction of the amplifier stage 5. For, if all the signal currents $I_s$ flows through T1 ($I_{s1} = I_s$, $i_{s2} = 0$) the gain is maximum, if the same amount of current flows through T1 as through T2 ($I_{s1} = i_{s2} = \frac{1}{2}i_s$) then the gain reduction is 6 dB and with a very small $I_{s1}$ ($i_{s2}/i_{s1}$ very high) the gain reduction is great.

As the ratio $I_2/I_1$ between the direct current components through the transistors T2 and T1 is equal to the ratio $i_{s2}/i_{s1}$ between the signal current components the value of the ratio $I_2/I_1$ is an accurate measure of the gain reduction realized in the stage 5 and much more accurate than the control voltage $V_{agc}$ which indeed effects the gain reduction but which is no accurate measure thereof.

The ratio $I_2/I_1$ is used in the circuit of FIG. 1 as follows to effect the take-over of the gain control by the stage 1. The direct current $I_1$ flows through resistor 17 and produces a D.C. voltage $V_B - I_1R_{17}$ at output terminal 11. In like manner the direct current $I_2$ flows through resistor 19 and produces a D.C. voltage $V_B = I_2R_{19}$ at the output terminal 10. The differential D.C. voltage between the terminals 10 and 11 therefore amounts to $I_1R_{17} - I_2R_{19}$. If now the control of the stage 5 has processed that for that this differential D.C. voltage becomes zero then it applies that $I_1R_{17} = I_2R_{19}$ so $I_2/I_1 = R_{17}/R_{19}$. In other words, the ratio between the resistors 17 and 19 determines the value of $I_2/I_1$ and, consequently, the degree of gain reduction in the stage 5, at which the differential voltage on the terminals 10 and 11 becomes zero. This decrease to zero of the differential voltage between the terminals 10 and 11 is detected by the threshold device 12, constructed as a difference voltage amplifier. This amplifier comprises two emitter-coupled transistors $T_3$ and $T_4$ whose bases are connected to the terminals 10 and 11 respectively and whose emitters are connected to a direct current source 20. The collector electrode of $T_3$ is connected to a load resistor 21 and to the control input 13 of the amplifier 1.

In general the value of the resistor 17 will be chosen greater than that of the resistor 19. With a large gain of the stage 5 the voltage across resistor 17 will then be greater than that across the resistor 19. This results in that the transistor T4 substantially conducts all the currents from the source 20 and that, consequently, the transistor $T_3$ is cut-off. The collector electrode of the transistor $T_3$ remains at chassis potential and the stage 1 is not controlled. If, owing to the gain control of the stage 5 the direct current $I_1$ through the resistor 17 decreases so much and the direct current $I_2$ through the resistor 19 increases so much that the voltage difference between the terminals 10 and 11 becomes substantially zero (or at least sufficiently small) then $T_3$ starts conducting a portion of the current of the source 20, the collector voltage of $T_3$ increases and the control of stage 1 begins. Now the control of stage 1 takes place through the stage 5 and the threshold circuit 12 which now both function as a D.C. voltage amplifier for the AGC-control voltage for the stage 1. On the other hand it is also possible, as will be further described with reference to FIG. 3, to have the control of the previous stage take place directly from the control voltage generating circuit 8, wherein the output of the difference amplifier 12 is only used to put this control out of operation, for example by inerrupting or by short-circuiting the control connection between the circuit 8 and the amplifier stage 1.

Figure 2:
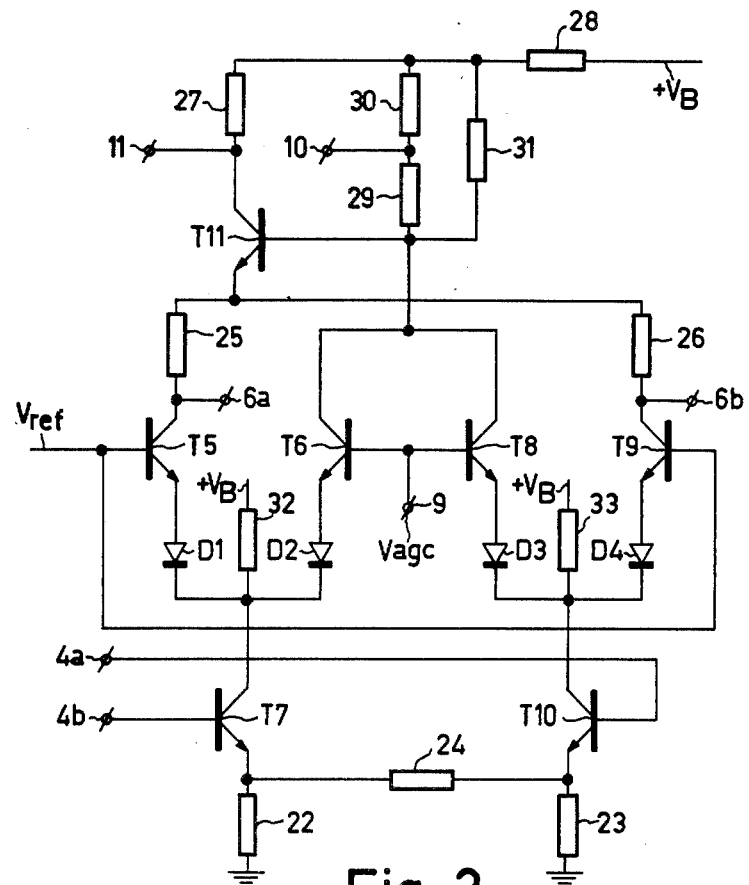
FIG. 2 shows an embodiment of an amplifier stage for use in a signal amplifier according to the invention and FIG. 3 shows a second embodiment of a signal amplifier according to the invention.

The amplifier stage of FIG. 2, which is used to replace the stage 5 of FIG. 1 is constructed in a balanced form. Consequently the input terminals (4a, 4b) and the output terminals (6a, 6b) can be balanced, and moreover decoupling (by pass) capacitors, such as the capacitors 16 and 18 of FIG. 1, can be dispensed with.

The circuit of FIG. 2 comprises control transistors T5 and T6 whose emitters are connected through diodes D1 and D2 to the collector of a transistor T7 having an emitter resistor 22, of, for example, 620 Ohms. In addition the circuit comprises control transistors T8 and T9 whose emitters are connected through diodes D3 and D4 to the collector of a transistor T10 with an emitter resistor 23 of also 620 Ohms. The bases of T7 and T10, whose emitters are interconnected through a 120 Ohm resistor 24, can be driven symmetrically through the input terminals 4a, Rb by the signal to be amplified so that the collector electrodes of T7 and T10 supply equal direct currents and inverse signal currents.

The base electrodes of T6 and T8 are connected together to control voltage input 9 and the base electrodes T5 and T9 to a fixed reference potential $V_{ref}$.

Each of the collector electrodes of T5 and T9 is connected through a signal load resistor 25 and 26 respectively of 810 Ohms to the emitter electrode of a transistor T11 whose collector electrode is connected through a 300 Ohm resistor 27 to a supply resistor 28 of 1.8 kOhm. The collector electrodes of T6 and T8 together are connected to the base of T11 and through a resistance network 29, 30, 31 to the supply resistor 28. The resistance network comprises the series arrangement of two resistors 29 and 30 of 1.5 kOhm and 91 Ohm respectively and in parallel thereacross a resistor 31 of 560 Ohms. The connection between the resistors 29 and 30 constitutes the terminal 10 of the differential control voltage output and the collector of T11 constitutes the terminal 11 of this output.

The signal current and the direct current of T7 are distributed across the transistors T5 and T6 owing to the control by the control voltage $V_{agc}$ and the portion of this current flowing through T5 results in a controlled signal voltage across the resistor 25 which can be taken off through the terminal 6a. The signal current of T10 is also distributed by the control voltage $V_{agc}$ in a corresponding manner over the transistors T8 and T9 and the portion of this current flowing through T9 results in a controlled signal voltage across the resistor 26 which can be taken off through the terminal 6b. As the signal currents through T7 and T10 are of the opposite phase also the signal voltages at the terminals 6a and 6b are of the opposite phase.

The two direct current components of T5 and T9 flow together through T11 and through the resistor 27. Likewise the two direct current components of T6 and T8 flow through the resistance network 29, 30, 31. In a corresponding manner as described with reference to FIG. 1 a differential D.C. voltage is available at the terminals 10 and 11 which becomes zero if the ratio between the said direct current components, and, consequently, the gain reduction of the stage has a given value which is determined by the resistors 27, 29, 30 and 31.

The transistor T11 serves to make the D.C. voltage level at the output terminals 6a and 6b constant, that is to say independent of the gain control, such that a subsequent stage is not affected by a shifting D.C. voltage level. With an increasing gain reduction the direct current through T5 and T9 decreases so that the D.C. voltage at the terminals 6a and 6b would increase. However, the simultaneously increasing direct current through T6, T8 causes an decreasing D.C. voltage at the base of T11 and consequently, owing to the emitter follower operation of T11, also a decreasing voltage at the top of the resistors 25 and 26. This voltage decrease compensates the voltage increase which would otherwise be produced at the terminals 6a and 6b if the resistance value of the network 29, 30, 31 equals approximately half the resistance value of each of the resistors 25 and 26. The voltage division of the resistors 29 and 30 is chosen such that the gain control take-over of the previous amplifier takes place at the proper current distribution in the transistors T5, T6, T8, T9. The resistor 31 has for its object to avoid that the resistor 30 must have a value which is too low to be easily integrated.

The diodes in series with the emitter electrodes of the control transistors improve the signal-to-noise ratio of the amplifier whilst retaining the desired exponential current-voltage characteristic of the semiconductor element formed by each control transistor with associated diode. The resistors 32 and 33 of 2.4 kOhm each between the collectors of the transistors T7 and T10 respectively on the one hand, and the supply voltage $V_B$ on the other hand reduce the noise contribution of the transistors T5, T6, T8, T9 whilst retaining a good large-signal-handling in the transistors $T_7$ and $T_{10}$.

In the circuits described above the ratio between the direct current components of the control transistor is determined by passing them through resistors (17, 19 in FIG. 1; 27, 30 in FIG. 2) with a predetermined mutual ratio and to detect when the voltages across these resistors are approximately equal to one another. It is, however, also possible to amplify or to attenuate one of the currents by a given factor, for example in a current mirror, and to subtract the other current therefrom. The resulting difference current is then measured and if it is zero or substantially zero the AGC-take-over is effected.

Figure 3:
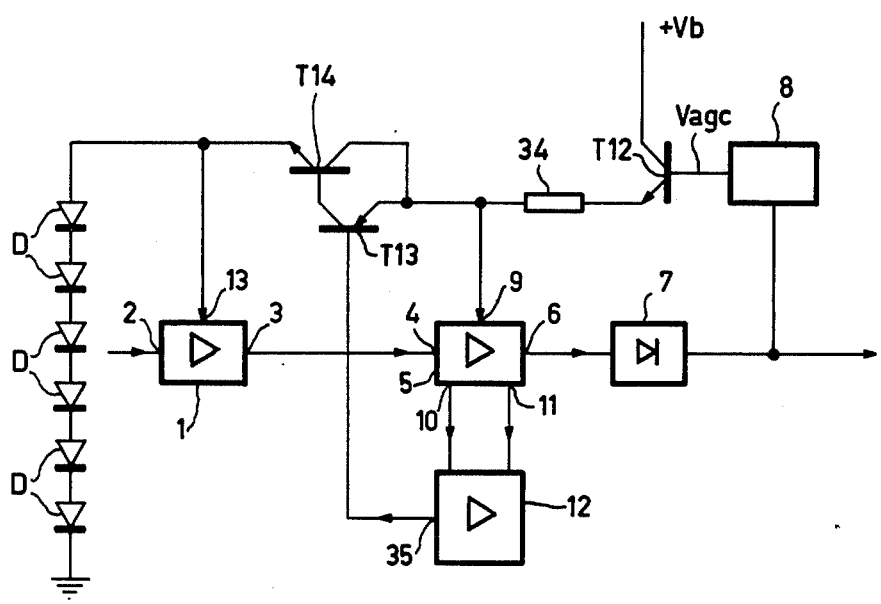

FIG. 3 shows a further embodiment of a circuit according to the invention wherein corresponding components have been given the same reference numerals as in FIG. 1 and in FIG. 2.

The gain control voltage $V_{agc}$ which is supplied by the control voltage generating circuit 8 is applied through an emitter follower transistor T12 and a resistor 34 of 4.7 kOhm to the control voltage input 9 of the second amplifier stage and also to the emitter electrode of an pnp-transistor T13 whose base electrode is connected to the output 35 of the amplifier 12. The collector electrode of the pnp-transistor T13 is connected to the base electrode of an npn-transistor T14; the collector electrode of T14 is connected to the emitter electrode of T13 and the emitter electrode of T14 is connected to the control input 13 of the first amplifier stage 1 and to a plurality of series-arranged diodes D. As known the pnp/npn-combination T13, T14 may be considered as one pnp-transistor with a large current gain having as emitter and base the emitter and base of T13 and as collector the emitter of T14.

The circuit of FIG. 3 operates as follows. The difference amplifier 12 and the coupling (10, 11) between this amplifier and the amplifier stage 5 are constructed such that at a low control voltage $V_{agc}$ at the control input 9 the D.C. voltage at the output 35 of the difference amplifier 12 is high. Consequently the transistor T13 is cut-off and as a consequence also the transistor T14. No current flows through the diodes D, the control input voltage of the first stage 1 is at chassis potential and the stage 1 is not controlled. As also the resistor 34 does not carry current the full control voltage $V_{agc}$ is found at the control input 9 of the stage 5 and this stage is controlled in the manner as described with reference to FIG. 1 and 2.

If the gain reduction in the stage 5 has substantially attained the predetermined value at which the take-over of the control by the stage 1 must take place, then the D.C. voltage at the output 35 starts decreasing. Owing to the large D.C. voltage gain in the stages 5 and 12 only a small increase in the control voltage $V_{agc}$ is required to effect a large take-off of the voltage at the output 35. Now the pair of transistors T13, T14 will start conducting with the following two effects:

1. Through the now conducting emitter-base junction of the transistor T13, a D.C. voltage feedback has been obtained from the control input 9 of the stage 5 through its control output 10-11 through the difference amplifier 12, through its output 35 and the transistor T13 which functions as an emitter follower. This feedback now keeps the control voltage at the input 9 rigorously at the level attained, for any further increase in the control voltage at the input 9 would cause such a large further voltage decrease at the base of T13 that the voltage increase at the input 9 would be cancelled. The constant level at the input 9 ensures that no further unwanted gain control of the stage 5 can take place anymore.

2. As the voltage at the input 9 is now constant a further increase in the control voltage $V_{agc}$ will cause a current increasing from zero through the resistor 34. This current flows through the transistors T13, T14, which are now conducting and the diodes D which now function as a collector load for the pnp-transistors T13, T14. Consequently a control voltage which increases from zero is now obtained at the control input 13 of this stage 1 for the control of this stage. The emitter follower T12 with series resistor 34 can be replaced in known manner by a gain control current source, for example from the collector of a transistor, with parallel resistor 34. The resistor 34, which functions in both cases as the internal resistance of a control voltage source, should not be too low, for example not lower than 1 kOhm, as otherwise the voltage at the control input 9 would vary too much during the control of the stage 1.

What is claimed is:

1. A gain-controlled signal amplifier comprising first and second cascaded gain-controllable amplifier stages, each having a control input means for controlling the gain of the respective stages, a threshold device means for delaying the control of the first stage until the gain of the second stage has been adjusted to a predetermined value, the second stage having a first current source means for supplying a signal current and a direct current, first and second semiconductor control elements coupled to said current source and having output circuits and substantially exponential current-voltage characteristics, only a first control element of the two elements being coupled to the signal output of the second amplifier stage, means for distributing said direct current and a signal current between said elements in accordance with a gain control voltage, and a circuit means for determining the ratio between the output direct currents of the two semiconductor control elements coupled to the output circuits of the two semiconductor control elements and for controlling the threshold device means to cause the start of the control of the first stage when said ratio attains a predetermined value.

2. A signal amplifier as claimed in claim 1, wherein said determining circuit means comprises output resistors coupled in the direct current output circuit of the two semiconductor control elements, said resistors comprising a differential direct current voltage output of the second amplifier stage, and wherein the threshold device means comprises a difference voltage detector means coupled to said differential direct current voltage output for starting the control of the first stage when the output voltage of the differential direct current voltage outputs falls below a given value.

3. A signal amplifier as claimed in claim 2, wherein the output resistance in the direct current output circuit of the first semiconductor control element considerably exceeds the output resistance in the direct current output circuit of the second semiconductor control element.

4. A signal amplifier as claimed in claim 2, wherein an output electrode of the first semiconductor control element is coupled through a signal output resistor to said output resistor in the direct current voltage output circuit, and further comprising a controllable resistance means coupled between the two output resistances and controlled from the direct current output circuit of the second semiconductor control element for providing that the direct current voltage level of the signal output of the first semiconductor control element remains substantially constant.

5. A signal amplifier as claimed in claim 2, further comprising a third and a fourth semiconductor control element each having a direct current output circuit, a second current source means for supplying a reverse signal current relative to said first current source means, said third and fourth elements being controlled by said gain control voltage to distribute the signal current from said second current source means between said third and fouth elements, the direct current output circuits of the semiconductor control elements being coupled wherein the output resistor in the direct current output circuit of the first semiconductor control element is also coupled in the direct current output circuit of the third semiconductor control element and the output resistor in the direct current output circuit of the second semiconductor control element is also coupled into the direct current output circuit of the fourth semiconductor control element.

6. A signal amplifier as claimed in claim 1, wherein the threshold device means comprises a transistor having emitter, base and collector electrodes, the emitter electrode being coupled to the control input means of the second stage, the base electrode being controlled by said determining circuit means, the collector electrode being coupled to the control input of the first stage, and further comprising a control voltage source having an internal resistance exceeding 1,000 ohms coupled to the control input of the second stage.

7. An amplifier as claimed in claim 4, wherein said controllable resistance means comprises a transistor.

* * * * *